(12) United States Patent
Kim et al.

(10) Patent No.: US 6,489,218 B1
(45) Date of Patent: Dec. 3, 2002

(54) SINGULATION METHOD USED IN LEADLESS PACKAGING PROCESS

(75) Inventors: Hyeongno Kim, Kyunggi-Do (KR); Hyung Jun Park, Kyunggi-Do (KR); Sangbae Park, Kyunggi-Do (KR); Junhong Lee, Kyunggi-Do (KR); Kun-A Kang, Kyunggi-Do (KR); Bae Doo Kim, Kyunggi-Do (KR)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/928,729

(22) Filed: Aug. 14, 2001

(30) Foreign Application Priority Data

Jun. 21, 2001 (TW) ........................ 90115514 A (51) Int. Cl.[7] ................ H01L 21/46; H01L 21/78; H01L 21/301
(52) U.S. Cl. ....................... 438/460; 438/107
(58) Field of Search ................ 438/107, 108, 438/112, 113, 114, 460, 461, 462, 463, 464, 465

(56) References Cited

U.S. PATENT DOCUMENTS 5,230,144 A * 7/1993 Ootsuki ................ 29/827
5,942,794 A 8/1999 Okumura et al. ........... 257/666
6,166,430 A * 12/2000 Yamaguchi ................. 257/666

FOREIGN PATENT DOCUMENTS

JP 09139362 A * 5/1997

* cited by examiner

Primary Examiner—David Nelms
Assistant Examiner—Phuc T. Dang (57) ABSTRACT

A singulation method comprising: (a) providing a molded product including semiconductor chips attached and electrically coupled to an upper surface of a lead frame wherein a lower surface of the lead frame is exposed from the bottom of the molded product, the lead frame including a plurality of units in an array arrangement and cutting streets between the units, each unit having a die pad and leads arranged at the periphery of the die pad, a first metal layer formed on the entire lower surface of the lead frame except the cutting streets; (b) etching the lower surface of the lead frame with the first metal layer as mask such that the cutting streets are etched away to form a plurality of grooves; and (c) cutting the etched molded product along the grooves to obtain the leadless semiconductor packages.

15 Claims, 7 Drawing Sheets

SINGULATION METHOD USED IN LEADLESS PACKAGING PROCESS

BACKGROUND OF THE INVENTION

1. Field of the Invention

This invention relates to a process for making leadless semiconductor packages and more specifically to a singulation method used in the leadless packaging process.

2. Description of the Related Art

Lead frame packages have been used for a long period of time in the IC packaging history mainly because of their low manufacturing cost and high reliability. However, as integrated circuits products move its endless pace toward both a faster speed and a smaller size, the traditional lead frame packages have become gradually obsolete for some high performance-required packages. Thus BGA (Ball Grid Array Packages) and CSP (Chip Scale Package) have emerged and become increasingly popular as a new packaging choice. The former has been widely used in IC chips that have higher I/Os and need better electrical and thermal performance than the conventional packages such as CPU and graphic chips. The latter has been widely used in mobile products of which the footprint, package profile and package weight are major concerns.

Figure 1:
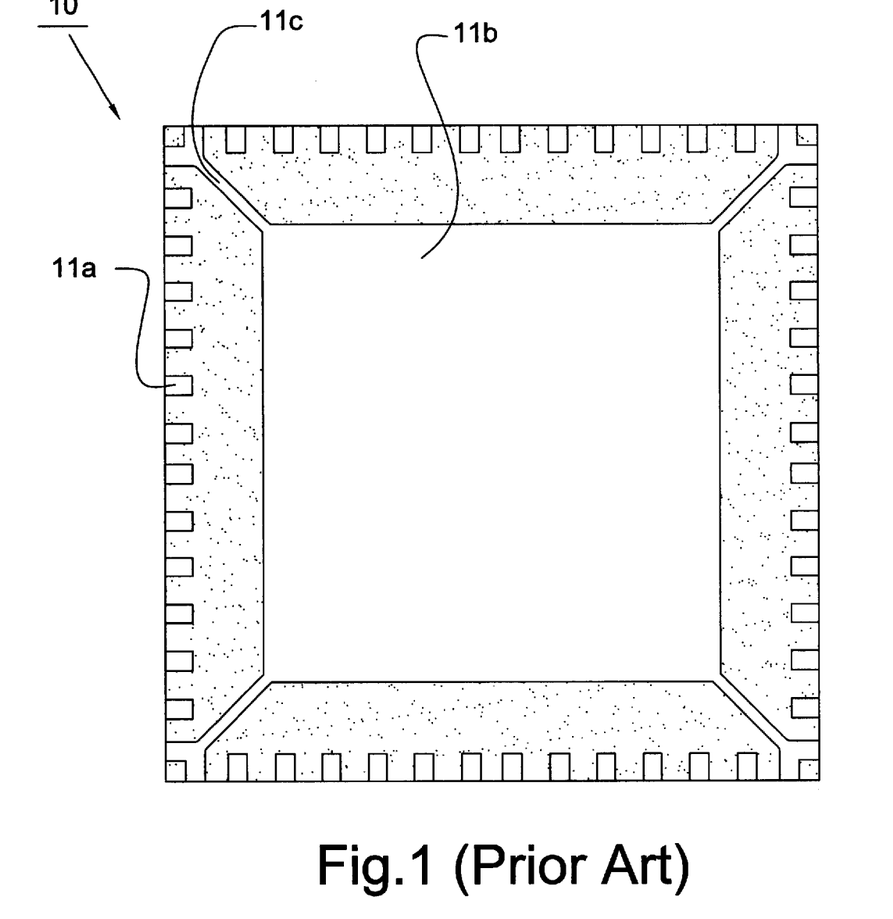
FIG. 1 is a bottom view of a conventional leadless package.

However, the lead frame package still remains its market share as a cost-effective solution for low I/O ICs. Traditional lead frame package has its limit of providing a solution for chip scale and low profile package due to the long inner leads and outer leads. Therefore, the semiconductor packaging industry develops a leadless package without outer leads such that both the foot print and the package profile can be greatly reduced. FIG. 1 shows a bottom view of a leadless package 10 wherein the leads 11 a are disposed at the bottom of the package as compared to the conventional gull-wing or J-leaded type package. The die pad 11b of the leadless package 10 is exposed from the bottom of the package thereby providing better heat dissipation. Typically, there are four tie bars 11c being connected to the die pad 11b.

Due to the elimination of the outer leads, leadless packages are featured by lower profile and light weight. Furthermore, due to the lead length reduction, the corresponding reduction in the resistance, conductance and capacitance make the leadless package 10 very suitable for RF (radio-frequency) product packages operating in several GHz to tens of GHz frequency range. It's also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

The conventional leadless packaging process comprises the following steps.

Figure 2:
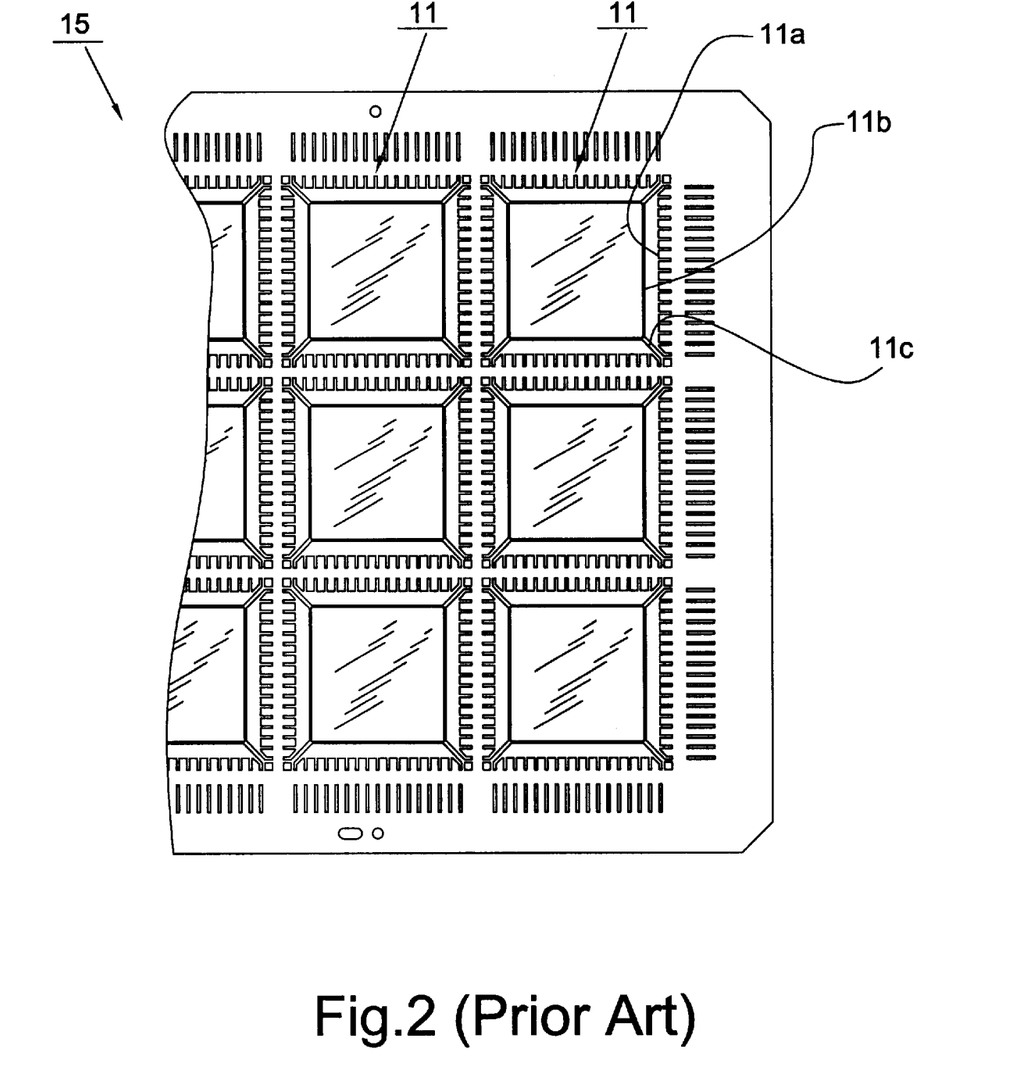
FIG. 2 is a top plan view of a conventional lead frame for use in forming leadless semiconductor packages.

Firstly, a polyimide (PI) tape was attached to the bottom of a lead frame, and this is to prevent the mold flash problem in the molding process. Typically, a lead frame (denoted as 15 in FIG. 2) for used in the MAP (mold array package) molding process comprises a plurality of units 11 each including a plurality of leads 11a arranged at the periphery of a die pad 11b. Each die pad 11b is connected to the lead frame 15 by four tie bars 11c.

Figure 3:
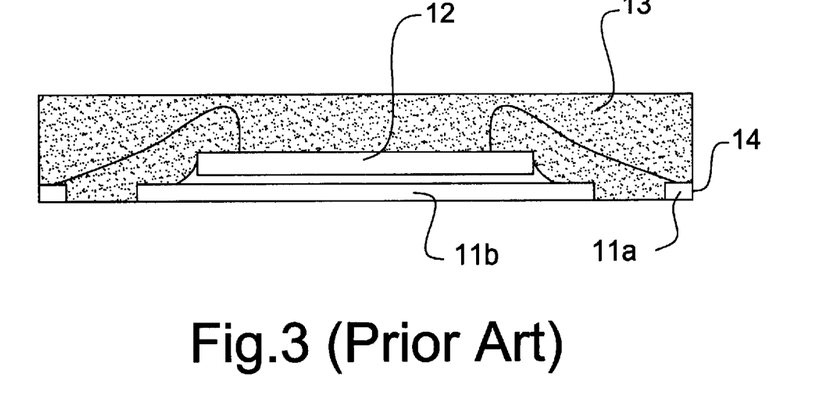
FIG. 3 is a cross sectional view of the leadless package of FIG. 1.

Then, referring to FIG. 3, IC chips 12 are attached to the die pads 11b by means of silver epoxy, and the epoxy is cured after die attach. After that, a regular wire-bonding process is performed to make interconnections between the silicon chips 12 and the leads 11a of the lead frame 15. After wire bonding, the lead frame 15 and the chips 12 attached thereon are encapsulated in a package body 13. Typically, a MAP molding process was used to accomplish this encapsulation. The PI tape is then removed after the molding process. The molded product is then marked with either laser or traditional ink. Finally, post-mold curing and singulation steps were conducted to complete the packaging process. In the singulation process, a resin-bond saw blade is used to cut the molded product into separate units along predetermined dicing lines to obtain the finished leadless semiconductor packages. Typically, the leadless semiconductor package 10 is mounted onto a substrate, such as a printed circuit board (PC board), by using conventional surface mount technology (SMT).

One major problem during the manufacturing of the package occurred in the singulation process. Since the saw blade has to cut through two different materials, i.e., the metal leadframe as well as the molding compound. Cutting through two different materials not only results in shorter blade life, but also creates lead quality problems such as metal burrs created at the lead cutting ends 14 of the leads 11a, which will introduce unsatisfactory coplanarity of the finished packages, thereby complicating and reducing the yield of the later SMT mounting process.

SUMMARY OF THE INVENTION

It is therefore an object of the present invention to provide a singulation method used in a leadless packaging process wherein the lifetime of the blade used in the singulation operation is significantly increased by avoiding direct cutting of the lead frame.

It is another object of the present invention to provide a singulation method used in a leadless packaging process wherein no metal burrs will be created during singulation such, that the finished leadless semiconductor packages will have a better coplanarity.

In order to achieve the object mentioned above, the present invention provides a singulation method comprising: (a) providing a molded product including a plurality of semiconductor chips attached and electrically coupled to an upper surface of a lead frame wherein a lower surface of the lead frame is exposed from the bottom of the molded product, the lead frame including a plurality of units in an array arrangement and a plurality of cutting streets between the units, each unit having a die pad and a plurality of leads arranged at the periphery of the die pad, a first metal layer formed on the entire lower surface of the lead frame except the cutting streets; (b) etching the lower surface of the lead frame with the first metal layer as mask such that the cutting streets are etched away to form a plurality of grooves; and (c) cutting the etched molded product along the grooves to obtain the leadless semiconductor packages.

Since the cutting streets of the lead frame are etched away during step (b), the lifetime of the blade is significantly increased by avoiding direct cutting of the cutting streets of the lead frame. Furthermore, since no metal burrs will be created when the blade cuts through the molded product, the finished leadless semiconductor packages will have a good coplanarity thereby enhancing the yield of the SMT mounting process.

The present invention further provides a process for making a plurality of leadless semiconductor packages. The process comprises the steps of: (a) providing a lead frame having opposing upper and lower surfaces, the lead frame including a plurality of units in an array arrangement and a plurality of cutting streets between the units, each unit having a die pad and a plurality of leads arranged at the periphery of the die pad, a first metal layer formed on the entire lower surface of the lead frame except the cutting streets; (b) attaching a plurality of chips onto the die pad of the lead frame; (c) electrically coupling the chips to the leads of the lead frame; (d) attaching a tape onto the lower surface of the lead frame; (e) encapsulating the chips against the upper surface of the lead frame to form a molded product; (f) removing the tape from the bottom of the molded product; (g) etching the bottom of the molded product with the first metal layer as mask; and (h) cutting the etched molded product along the cutting streets to obtain the leadless semiconductor packages. Preferably, each of the leads is half-etched at its lower surface to form an indentation at a location adjacent to the cutting street. During the step (e), the molding compound will fill in the indentations thereby helping to reduce the "undercut" problem occurred in the isotropic etching process.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

FIG. 5a to FIG. 5h illustrates a process for making a plurality of leadless semiconductor packages according to a preferred embodiment of the present invention.

Figure 4:
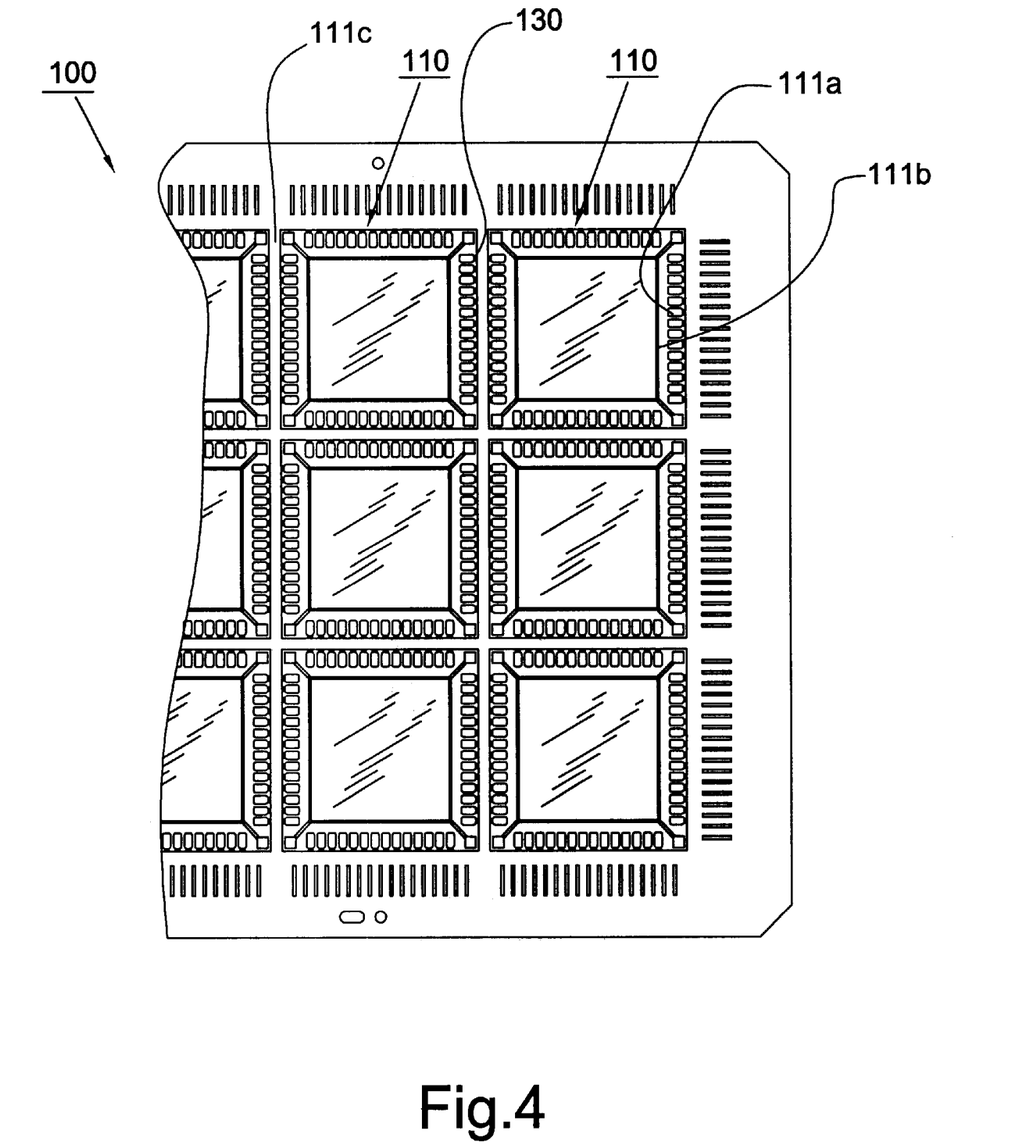
FIG. 4 is a top plan view of a lead frame for use in forming leadless semiconductor package in accordance with the present invention.
Figure 5A:
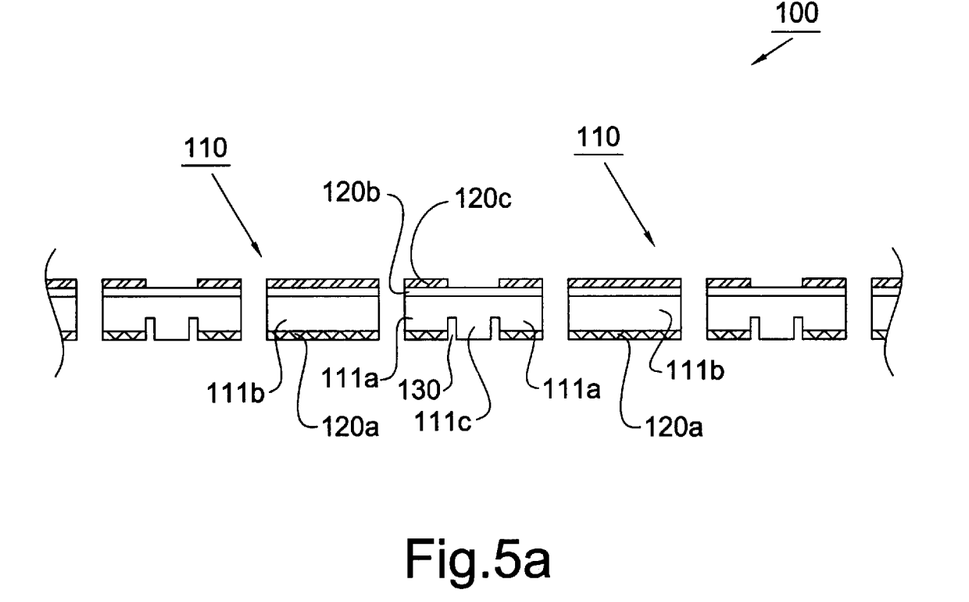
FIG. 5a to FIG. 5h illustrate a process for making a plurality of leadless semiconductor packages according to a preferred embodiment of the present invention.

FIGS. 4 and 5a shows a portion of a lead frame 100 for used in the MAP (mold array package) molding process in accordance with the present invention. The lead frame 100 has an upper surface and a lower surface opposed to the upper surface. The lead frame 100 comprises a plurality of units 110 each including a plurality of leads 111a arranged at the periphery of a die pad 111b. The units 110 of the lead frame 100 are separated from each other by a plurality of cutting streets 111c. The cutting streets 111c generally form an orthogonal grid on the lead frame 100. Specifically, the cutting streets 111c are defined between the leads 111a at the periphery of the die pads 111b. The lead frame 100 is typically made of a copper-base alloy or made of copper or alloys containing copper, and shaped by pressing or etching. It is noted that the entire lower surface of lead frame 100 is plated with a first metal layer 120a except areas on the cutting streets 111c. The entire upper surface of lead frame 100 is plated with a second metal layer 120b. Preferably, the first metal layer 120a and the second metal layer 120b are formed of nickel. Further, a third metal layer 120c is formed over the second metal layer 120b on the upper surface of lead frame 100 except areas corresponding to the cutting streets 111c. Preferably, the third metal layer 120c is formed of materials that allow a good bond to the conventional bonding wire material, e.g., silver. Preferably, each lead 111a is half-etched at its lower surface to form an indentation 130 at a location adjacent to the cutting street 111c.

Figure 5B:
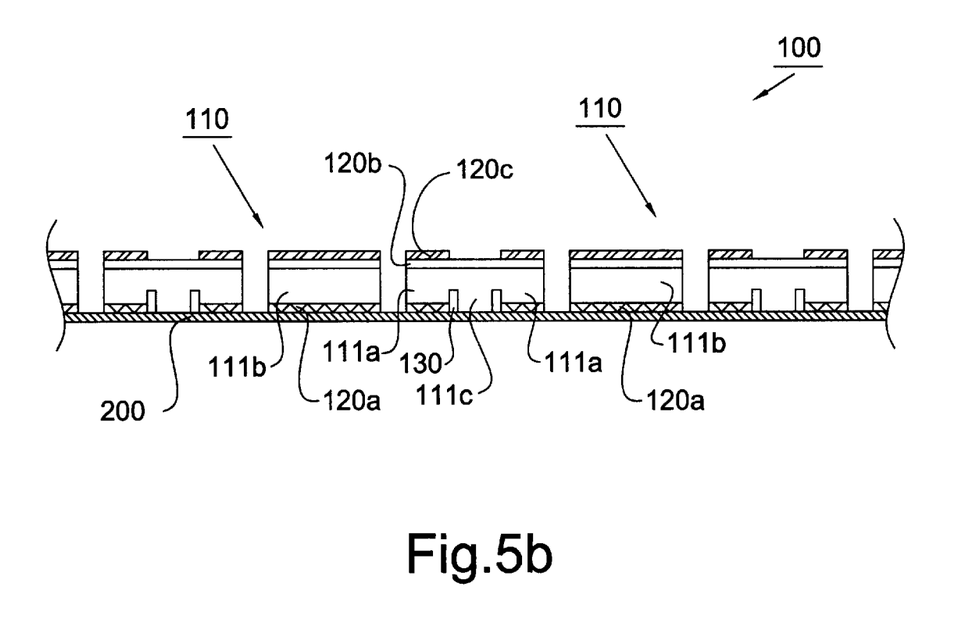

Referring to FIG. 5b, a polyimide (PI) tape 200 is attached onto the lower surface of the lead frame 100, and this is to prevent the mold flash problem in the molding process.

Figure 5C:
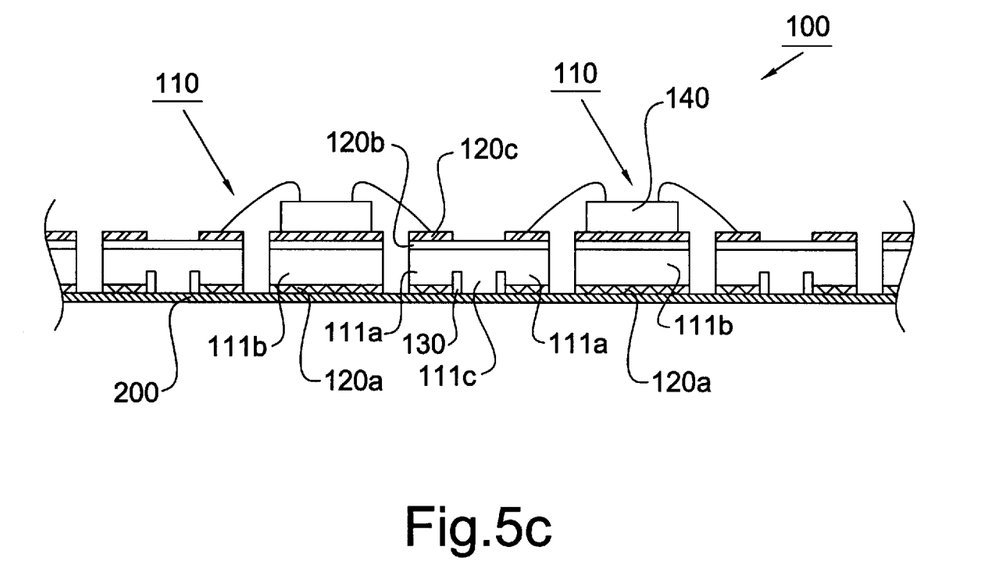

Referring to FIG. 5c, semiconductor chips 140 are respectively attached to the die pads 111b by means of silver epoxy (not shown), and the epoxy is cured after die attach. After that, a regular wire-bonding process is performed to make interconnections between the semiconductor chips 140 and the leads 111a of the lead frame 100.

Figure 5D:
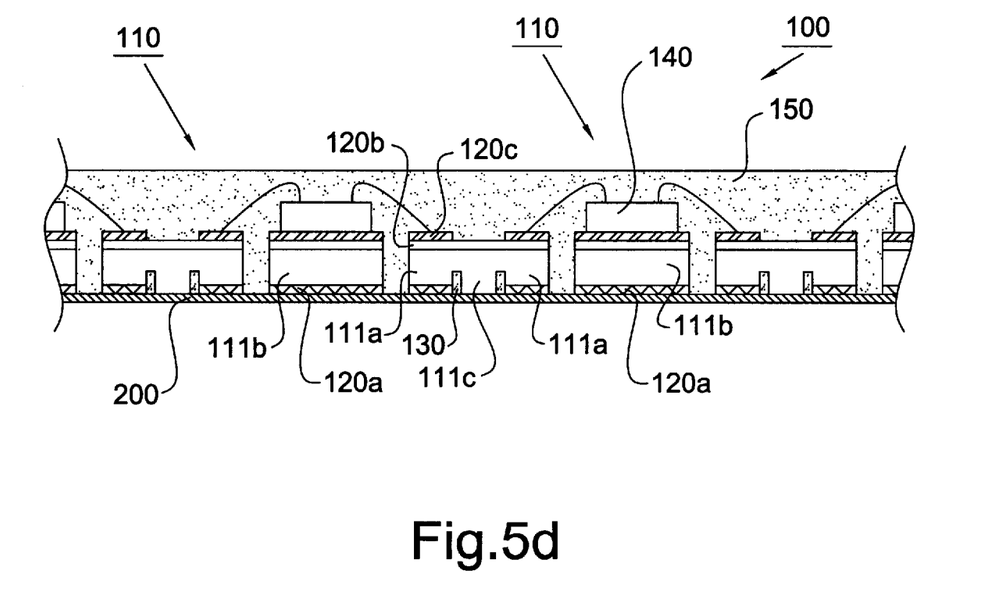

Referring to FIG. 5d, after wire bonding, the chips 140 are encapsulating against the upper surface of the lead frame 100 to form a molded product. After encapsulating, the chips 140 and the upper surface of the lead frame 100 are encapsulated by a package body 150. Usually, a MAP (mold array package) molding process is used to accomplish this encapsulation. During the encapsulating process, molding compound will flow into the indentations 130 of the leads 111a; hence, after curing, the indentations 130 is embedded in the package body 150 formed from the molding compound.

Figure 5E:
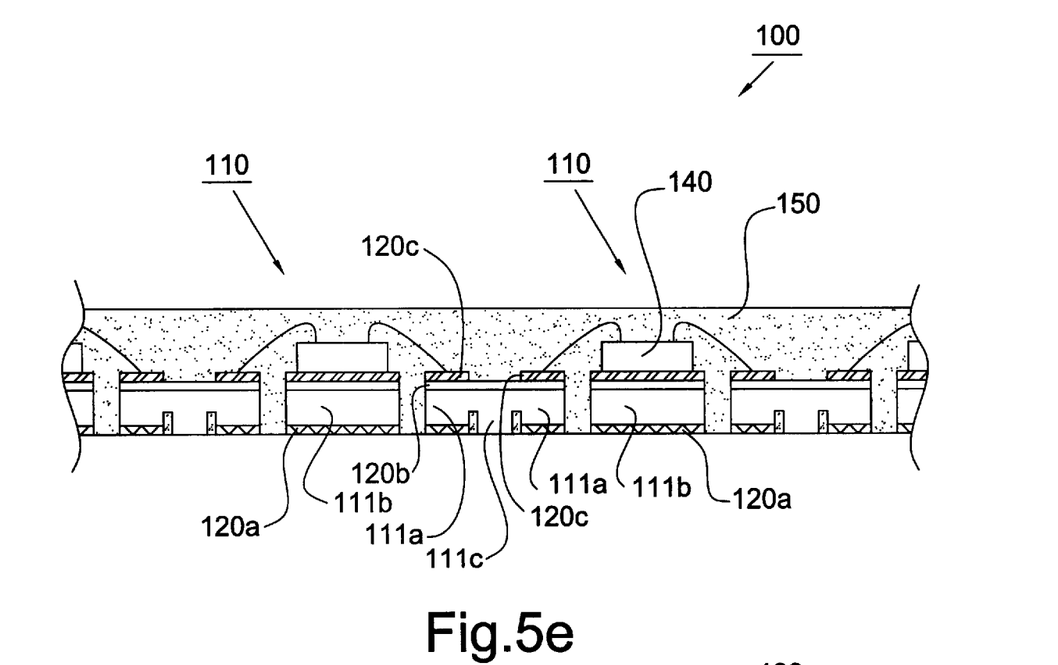

Referring to FIG. 5e, the PI tape 200 is removed after the molding process. The molded product is then marked with either laser or traditional ink.

Figure 5F:
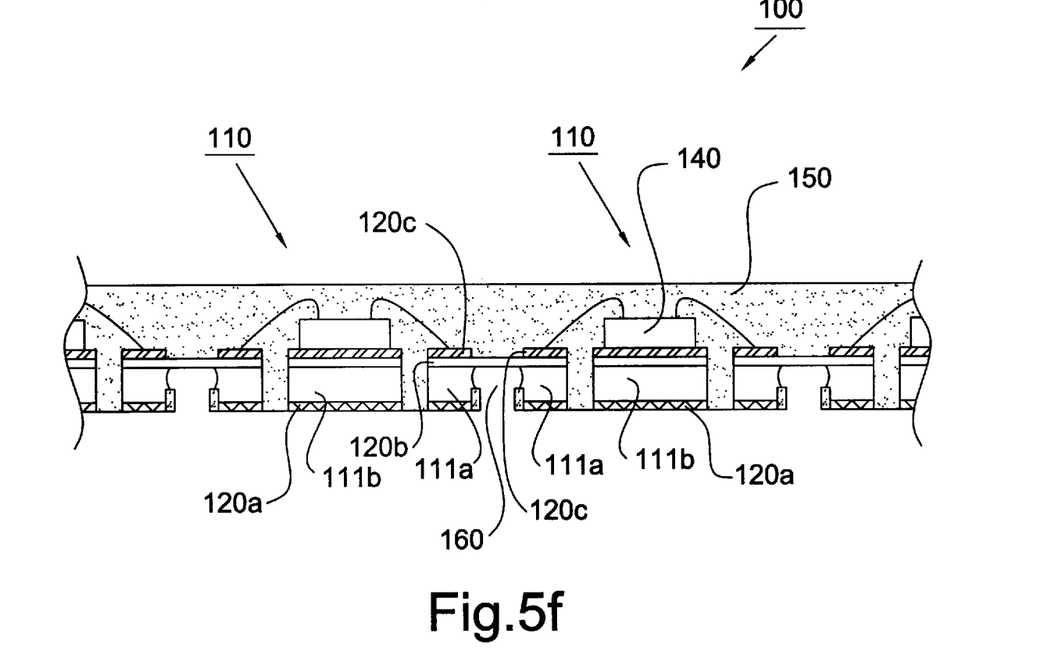

Referring to FIG. 5f, after removing the tape 200, the lower surface of the lead frame 100 is exposed from the bottom of the molded product. As shown, the cutting streets 111c are removed in an etching process. Specifically, the etching process is conducted by etching the lower surface of the lead frame 100 with the first metal layer 120a as mask. Since the entire lower surface of lead frame 100 is plated with the first metal layer 120a except the cutting streets 111c, only the cutting streets 111c without the protection of the first metal layer 120a are etched away to form a plurality of grooves 160. It is noted that, after the etching operation, the second metal layer 120b exposed in the grooves 160 is remain intact. Furthermore, the molding compound filled in the indentations 130 can help to reduce the "undercut" problem occurred in the isotropic etching process.

Figure 5G:
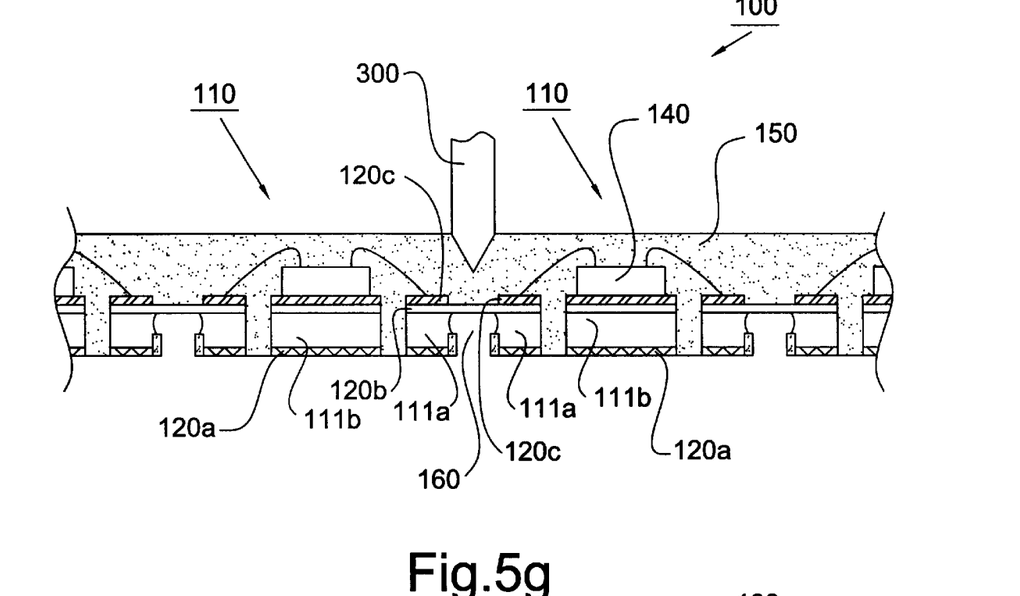
Figure 5H:
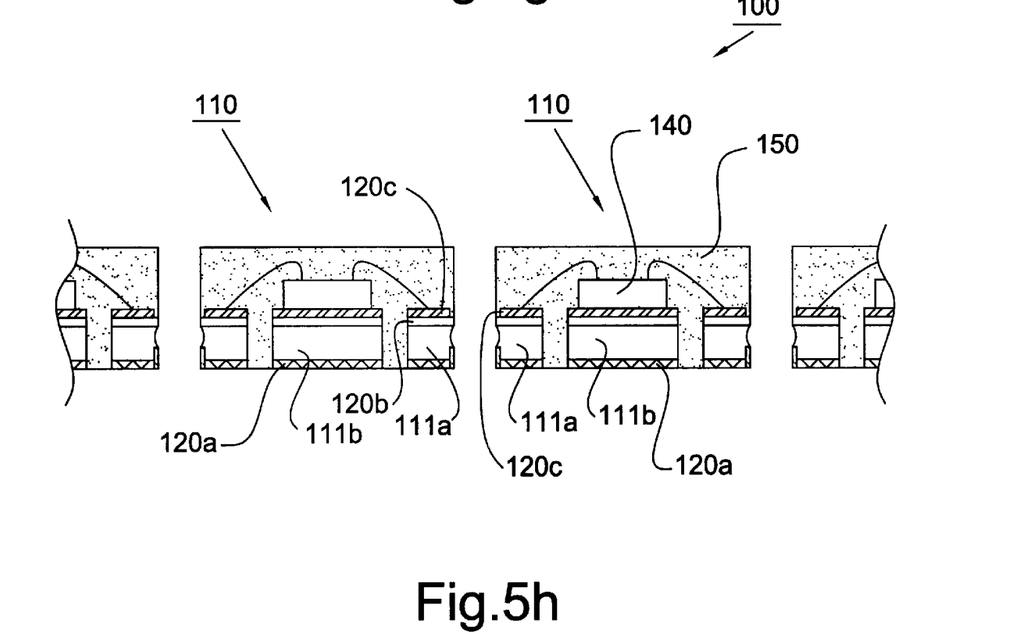

Referring to FIG. 5g and FIG. 5h, a singulation step is conducted to complete the packaging process. As shown in FIG. 5g, a resin-bond saw blade 300 is used to cut through the molded product into separate units along the grooves 160. Since the cutting streets of the lead frame are etched away, only the package body 150 and the second metal layer 120b exposed in the groove 160 is cut by the blade 300. The lifetime of the blade 300 is significantly increased by avoiding direct cutting of the cutting streets 111c of the lead frame. Furthermore, since no metal burrs will be created when the blade 300 cuts through the molded product, the finished leadless semiconductor packages have a better coplanarity (as shown in FIG. 5h) thereby enhancing the yield of the SMT mounting process.

The finished leadless semiconductor package can be mounted onto a substrate, such as a printed circuit board (PC board), like other leadless devices. For example, a PC board is screen printed with a solder paste in a pattern that corresponds to the pattern of the leads exposed from the bottom of the package. The package is then appropriately positioned on the PC board and the solder is reflowed by using the conventional surface mount technology.

Alternatively, the leads exposed from the bottom of the package can be printed with solder paste and then mounted onto the PC board. Preferably, a tin/lead-plating step is performed before soldering the package to PCB thereby enhancing solderability. Specifically, a layer of tin/lead is plated on the leads exposed from the bottom of the package immediately after the etching process and before the singulation step. It is noted that the second metal layer 120b exposed in the grooves 160 functions as electric path for plating.

It could be understood that the "half-etching" of the present invention is conventional technique, which comprises: (a) forming a photoresist layer on the lower surfaces of the lead frame by conventional techniques such as dry film lamination. Typically, the photoresist layer is mainly composed of a resin mixture, and a photoactive material which makes the photoresist layer photodefinable; (b) photodefining the photoresist layer through a photomask and developing such that areas on the lower surfaces of the lead frame at which they are desired to form the indentations are not covered by the photoresist; (c) etching areas on the lower surfaces of the lead frame exposed from the remaining photoresist layer to form the indentations; (d) stripping the remaining photoresist by using conventional techniques. It is noted that the "half-etching" herein does not mean only exactly removing half of the thickness of the lead frame through etching but also includes a partial etching for removing merely a part of the thickness of the lead frame.

Although the invention has been explained in relation to its preferred embodiment, it is to be understood that many other possible modifications and variations can be made without departing from the spirit and scope of the invention as hereinafter claimed.

What is claimed is:

1. A singulation method used in a process for making a plurality of leadless semiconductor packages, the singulation method comprising the following steps:

providing a molded product including a plurality of semiconductor chips attached and electrically coupled to an upper surface of a lead frame wherein a lower surface of the lead frame is exposed from the bottom of the molded product, the lead frame including a plurality of units in an array arrangement and a plurality of cutting streets between the units, each unit having a die pad and a plurality of leads arranged at the periphery of the die pad, a first metal layer formed on the entire lower surface of the lead frame except the cutting streets;

etching the lower surface of the lead frame using the first metal layer as a mask such that the cutting streets are etched away to form a plurality of grooves; and cutting the etched molded product along the grooves to obtain the leadless semiconductor packages.

2. The method as claimed in claim 1, further comprising the step of half-etching each of the leads at its lower surface to form an indentation at a location adjacent to the cutting street.

3. The method as claimed in claim 1, wherein the first metal layer is made of nickel.

4. The method as claimed in claim 1, wherein the first metal layer is formed by plating.

5. The method as claimed in claim 1, wherein the lead frame is made of copper.

6. A process for making a plurality of leadless semiconductor packages, comprising the following steps:

providing a lead frame having opposing upper and lower surfaces, the lead frame including a plurality of units in an array arrangement and a plurality of cutting streets between the units, each unit having a die pad and a plurality of leads arranged at the periphery of the die pad, a first metal layer formed on the entire lower surface of the lead frame except the cutting streets;

attaching a plurality of chips onto the die pads of the lead frame;

electrically coupling the chips to the leads of the lead frame;

attaching a tape onto the lower surface of the lead frame;

encapsulating the chips against the upper surface of the lead frame to form a molded product;

removing the tape from the bottom of the molded product to expose the lower surface of the lead frame;

etching the lower surface of the lead frame using the first metal layer as a mask such that the cutting streets are etched away to form a plurality of grooves; and cutting the etched molded product along the grooves to obtain the leadless semiconductor packages.

7. The process as claimed in claim 6, further comprising the step of half-etching each of the leads at its lower surface to form an indentation at a location adjacent to the cutting street.

8. The process as claimed in claim 6, wherein the first metal layer is made of nickel.

9. The process as claimed in claim 6, wherein the first metal layer is formed on the lower surface of the lead frame by plating.

10. The process as claimed in claim 6, wherein the lead frame is made of copper.

11. The process as claimed in claim 6, wherein the entire upper surface of lead frame is plated with a second metal layer.

12. The process as claimed in claim 11, after the etching step and before the cutting step, further comprising the step of plating a layer of tin/lead on the leads exposed from the bottom of the molded product with the second metal layer exposed in the grooves functioning as an electric path for plating.

13. The process as claimed in claim 12, wherein the second metal layer is made of nickel.

14. The process as claimed in claim 12, wherein a third metal layer is formed over the second metal layer on the upper surface of lead frame except areas corresponding to the cutting streets.

15. The method of claim 7, wherein said half-etching is performed prior to said encapsulating and an encapsulating material is filled in said indentation during said encapsulating.

* * * * *